(12) United States Patent
Schnaitter

(10) Patent No.: US 6,429,491 B1
(45) Date of Patent: *Aug. 6, 2002

(54) ELECTROSTATIC DISCHARGE PROTECTION FOR MOSFETS

(75) Inventor: William N. Schnaitter, San Ramon, CA (US)

(73) Assignee: Transmeta Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/421,614

(22) Filed: Oct. 20, 1999

(51) Int. Cl.[7] .......................... H01L 23/62; H01L 29/76
(52) U.S. Cl. .................... 257/362; 257/356; 257/378
(58) Field of Search ................................ 257/360, 361, 257/370, 355–363, 372, 373, 546, 547, 378

(56) References Cited

U.S. PATENT DOCUMENTS 5,449,939 A * 9/1995 Horiguchi et al. .......... 257/360
5,910,675 A * 6/1999 Horiguchi et al. .......... 257/370

* cited by examiner

Primary Examiner—Tom Thomas
Assistant Examiner—Ori Nadav
(74) Attorney, Agent, or Firm—Stephen L. King

(57) ABSTRACT

A MOSFET transistor (2 FIG. 4) contains functional elements that together define an electrical capacitance (20, 27, 10–13) capable of accumulating a static electrical charge transferred from an external source, when the transistor is out of or removed from a circuit. An additional semiconductor device (21, 30, 11, 13) is integrated within said transistor and bypasses electrical charge from the capacitance to prevent such static charge from attaining a level at which said voltage spanning the dielectric element of the capacitance is sufficient to destroy the dielectric element. The foregoing protects the MOSFET and associated circuitry against static electricity without adversely affecting normal operation. In one embodiment, the additional semiconductor device is a lateral bipolar transistor.

7 Claims, 1 Drawing Sheet

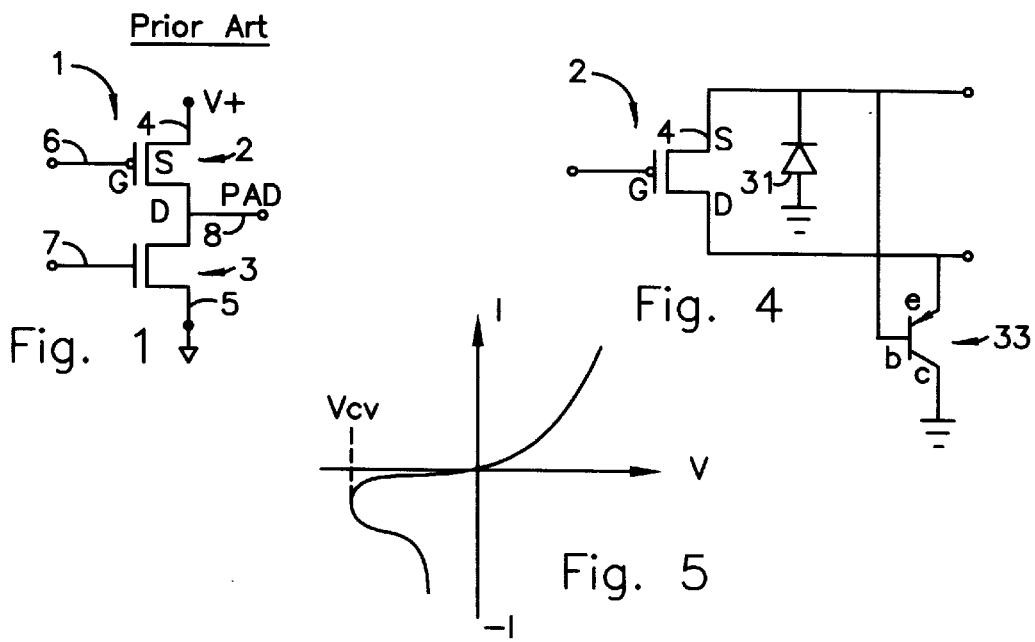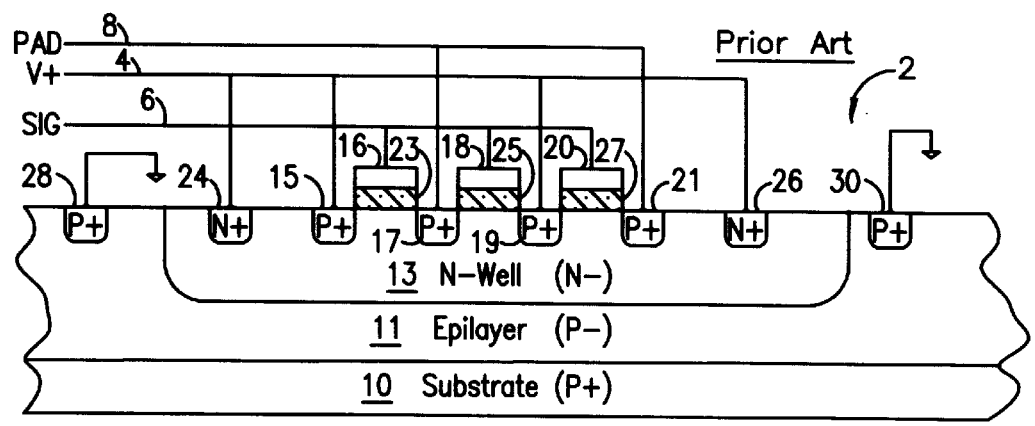
Fig. 2
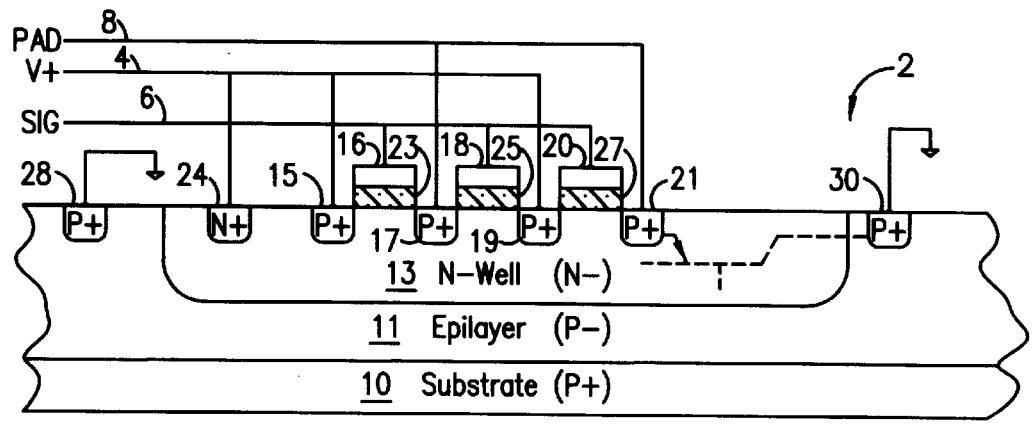
Fig. 3

ELECTROSTATIC DISCHARGE PROTECTION FOR MOSFETS

FIELD OF THE INVENTION

This invention relates to combined MOSFET/bipolar transistor construction, and, more particularly, to a transistor construction that contains built-in protection against potentially destructive static electricity.

BACKGROUND

Static electricity is of particular concern to manufacturers and users of semiconductor devices, the field to which the present invention is directed. Metal-on-silicon field effect transistors, "MOSFETS", are particularly vulnerable to static electricity. Discharging the static electric charge built up on the body of a person, or on parts of automated equipment, through a MOSFET may destroy the transistor by breaking down and physically rupturing the internal structure of the transistor, specifically, the dielectric insulating element. Breakdown of that element renders the transistor non-functional.

The gate of presently available MOSFETs is insulated by a layer of glass ($SiO_2$) that is only a few tens of angstroms (IA=0.1 nm) thick. That insulating layer serves as the dielectric between the gate and the body region of the MOSFET. The foregoing three elements of an individual MOSFET define an electrical capacitor.

As is known, the capacitance value (sic capacitance) of a capacitor is directly proportional to the confronting area of spaced conductive plates, inversely proportional to the space separating (and insulating) the plates from one another and is directly proportional to the dielectric constant of the insulating material (the dielectric) disposed in the separating space. When an electrical charge is transferred to a capacitor, a voltage develops between the spaced plates, creating an electric field through the dielectric. The resulting electric field may be strong enough to damage the dielectric.

An integrated circuit (IC) contains many different electronic devices formed of transistors all of which are fabricated upon a single substrate of semiconductive material. Those electronic devices may include large numbers of CMOS gates, logic devices, that serve as input-output (I/O) drivers, the function of which is to supply driving current to other devices. Each such CMOS gate may be formed of an N-channel transistor and a P-channel transistor connected electrically in series, referred to as a complementary MOSFET pair. Those I/O transistors are exposed to possible contact with external sources of electrical charge. Should a single transistor on that integrated circuit be destroyed by an electrostatic discharge, the entire integrated circuit becomes useless.

Accordingly, an object of the present invention is to protect transistors from static electricity.

And a further object of the invention is to protect transistors and associated circuitry from the destructive effect of static charge that originates from sources external to the transistors.

SUMMARY OF THE INVENTION

In accordance with the invention, a MOSFET transistor contains functional elements that together define an electrical capacitance, which may be damaged by a static electrical charge, when not connected in a circuit. The novel additional semiconductor device, a lateral bipolar transistor, is incorporated within the MOSFET to bypass the charge harmlessly, preventing that charge from attaining a level at which said voltage spanning the dielectric element of the MOSFET breaks down the dielectric. While serving to protect the MOSFET against static electricity, the bipolar transistor does not adversely affect normal operation of the MOSFET.

The foregoing and additional objects and advantages of the invention together with the structure characteristic thereof, which was only briefly summarized in the foregoing passages, will become more apparent to those skilled in the art upon reading the detailed description of a preferred embodiment of the invention, which follows in this specification, taken together with the illustrations thereof presented in the accompanying drawings.

BRIEF DESCRIPTION OF THE DRAWINGS

In the drawings:

FIG. 1 symbolically illustrates a CMOS gate typically included in an integrated circuit;

FIG. 2 illustrates the structure of a prior P-channel field effect transistor that is included within the gate of FIG. 1 in a simplified not-to-scale pictorial section view;

FIG. 3 illustrates an embodiment of the invention in a simplified not-to-scale pictorial section view;

FIG. 4 schematically illustrates the embodiment of FIG. 3; and

FIG. 5 illustrates the V-I curve of a bipolar transistor component included in the embodiment of FIG. 3 and schematically illustrated in FIG. 4.

DETAILED DESCRIPTION OF THE PREFERRED EMBODIMENTS

The invention is explained in connection with a known complementary MOS gate(CMOS), containing two MOSFETS, such as are symbolically illustrated in FIG. 1, and to the structure of the P-channel field effect transistor (FET), illustrated in section in FIG. 2. Referring to FIG. 1, CMOS gate 1 contains both a P-channel field effect transistor (FET) 2 and an N-channel FET 3 that are serially connected in the familiar inverter configuration. The drain terminal of FET 2 connects to the drain terminal of FET 3, the source of FET 2 connects via lead 4 to a voltage source V+, and the source terminal of FET 3 connects via lead 5 to the circuit ground, to place the two transistors electrically in series.

CMOSFET gate 1 contains a first input 6 to FET 2 and a second input 7 to the N-channel FET 3. The output of CMOS gate 1 is taken at the circuit juncture connecting the two transistors together, labeled as pad 8.

Gate 1 is found in great numbers in integrated circuits. The function of the gate is to supply driving current to input-output circuits of a microprocessor, as an example. The operation of that gate is well known and is not repeated here. As later described in greater detail, the present invention changes the structural design of the P-channel FET of such a CMOS gate. Although described in connection with a P-channel FET, it should be realized that the invention may also be accomplished in alternative embodiments which are accomplished in an N-channel version.

FIG. 2 is a simplified pictorial cross-section, not-to-scale, of a typical high power P-channel MOSFET transistor 2. As shown in FIG. 2, transistor 2 is fabricated on a substrate 10 of semiconductor material, such as silicon, that is heavily doped with acceptor ions (P+). An epilayer 11 overlies the substrate and is lightly doped with acceptor ions (P–). A N-well 13 is formed in the epilayer and is lightly doped with donor ions (N−). A plurality of separate spaced source/drain regions 15, 17, 19, and 21 are formed on the upper surface of the material in the region overlying N-well 13. The source/drains are formed by doping the material in the N-well positive (P+) with acceptor ions at the individual spaced locations.

A gate electrode 16 overlies the N-well region between (and bridges the gap between) source/drains 15 and 17; a second gate electrode 18 overlies the N-well region between (and bridges the gap between) source/drains 17 and 19, and a third gate electrode 20 overlies the N-well region and bridges the gap between source/drains 19 and 21. Each such gate electrode is formed over a thin insulating layer 23, 25 and 27, respectively. The insulating layers are formed in the upper surface of the N-well so that the gates are insulated from (and in spaced relation to) the N-well below.

The insulating layers are conventionally formed of silicon oxide and is very thin, on the order of tens of Angstroms in thickness. The dimensions, spacing, dopants and the like for such a transistor are well known to those skilled in the art and need not be described.

For the illustrated CMOSFET logic device, an inverter, alternate regions, the source regions, 15 and 19, are connected to power (V+). The drain regions, 17 and 21, are connected to the pad electrode. Essentially, the greater the number of drain/source regions in a FET and the greater the width of those regions, the greater is the current conducting capacity of the transistor.

Although the foregoing elements essentially define a high power P-channel transistor, additional electrical contacts are always required. Existing design rules used by those skilled in the art require two additional contacts (or regions) 24 and 26 of N-type material heavily doped with donor ions (N+) formed within N-well 13, one located on either side of the group of source/drains 15 through 21 defining the basic transistor. Those design rules also require a further pair of contacts 28 and 30 formed of P-type material, heavily doped with acceptor ions (P+), formed in the surface of the epilayer 11 to the side of N-well 13. Each such contact is located to the far side of contacts 24 and 21, respectively.

The former contacts 24 and 26 are provided to get good electrical contact to the N-well 13. The latter contacts 28 and 30 are for connecting epilayer 11 and substrate 10 to electrical ground, as illustrated. Contacts 24, situated in N-well 13, and 28, within epilayer 11, are seen to define the structure of a back-biased diode.

It should be understood that the foregoing transistor is formed as an element of the gate represented in FIG. 1. In turn that gate is part of an integrated circuit (IC) that contains many gates and other semiconductor devices formed upon a single semiconductor substrate.

Additionally, as fully assembled, the integrated circuit is housed within a semiconductor case or package. That package contains externally protruding electrical leads necessary to connect the integrated circuit into a socket mounted on a circuit board or otherwise connect the IC to other electronic circuits. Internal to such package, the terminal pads or contacts on the doped substrate are connected by electrical wires, typically by wire bonding, to the ends of the foregoing leads on the inside of the package. Thus in handling the IC, one may grip the IC package, and, sometimes, one may inadvertently touch one or more of those external leads. Any static electricity being carried on one's body would then access the confined IC.

An embodiment of the invention is illustrated in FIG. 3 which is similar in structure to the transistor just considered in FIG. 2. For convenience and ease of understanding the elements in this figure are given the same numerical designation assigned to those elements in FIG. 2.

Inspection of FIG. 3 shows all of the structure of this new transistor is the same as in the transistor of FIG. 2 with few exceptions. The N+ contact 26 is not included in the structure; the N-well 13 is of a lesser width than before; and the P+ contact 30 is positioned laterally inward due to is the reduced width of the N-well.

The region between and including source (P+) region 21, situated in the lightly doped (N−) N-well 13, and (P+) contact 30, located in the lightly doped (P−) epilayer 11, in FIG. 3 defines the structure of a diode-connected lateral bipolar PNP junction transistor. To assist understanding, a symbol for the transistor, drawn in dash lines, is included in the figure. Placement of the N-well edge enclosing the drain region 21, which acts as the emitter region of the bipolar transistor, should be at the minimum allowed spacing from drain region 21. That location minimizes the "base width". Also contact 30 on the outside of N-well 13, is located at the minimum allowed distance outside the N-well edge. That location minimizes the series resistance of the collector in the bipolar transistor. The N-well acts as the base region and epitaxy region 11 acts as the collector of the formed bipolar transistor. The foregoing minimum spacings result in the most effective bipolar transistor. FIG. 4, to which reference is made, is a symbolic illustration of the P-channel transistor of FIG. 3. The conventional P-channel FET transistor 2, includes source S. drain D, gate G. and body B. The back-biased diode formed in the substrate between contact 28 and contact 24 is represented as 31. The lateral bipolar transistor formed in accordance with the foregoing description, is represented at 33, containing the familiar emitter E, collector C and base B. The base, formed of the N-well region 13, is electrically connected to emitter E, formed of the P+ drain region 21, to define a diode-connected transistor.

A lateral bipolar transistor typically obtains a current gain (current amplification) of about 5 to 35. Thus for every unit of current passing out of the base B, the current passing out of collector C is 5 to 35 times larger. Further, bipolar transistors possess an I-V characteristic, such as represented in FIG. 5, that is useful to over-voltage protection. When reverse biased, which is the present circuit, there is no substantial current flow until a certain voltage, the critical voltage of the formed circuit, Vcv, is attained. Beyond that point, current increases; and, as current increases further, the voltage across the transistor drops below the critical voltage.

Both effects offer significant advantage over that available from solely a simple diode, such as that formed between contacts 24 and 28 in the prior art MOSFET of FIG. 2. The effects serve to shunt or bypass static electric charge, reducing the peak electric field developing in the gate dielectric (23, 25, and 27 in FIG. 3).

Returning to FIG. 4, with the transistor out-of-circuit, a source of electrostatic charge that contacts, as an example, the transistor's source S may commence transfer of charge into the transistor that produces an electric field within the gate insulator, proportional to the amount of transferred charge and inversely proportional to the capacitance area and dielectric constant of the insulator material. Accumulation of a large amount of charge also results in a high voltage across the bipolar transistor, which activates ("turns-on") and conducts current to help remove the electric field from the dielectric. The circuit is fast-acting and, hence, is able to shunt or bypass the charge around the gate insulator while the charge is being transferred from an external source, such as an individual or equipment.

The foregoing embodiment of the invention was illustrated and described in connection with a P-channel MOSFET. However, as those skilled in the art realize from the foregoing description, in other embodiments the invention can be applied to the less popular N-channel MOSFETs in ICs with N-type substrate, to define a lateral NPN bipolar transistor. As those skilled in the art appreciate, such a structure would appear identical to that presented in FIG. 3, but in which all of the polarities are reversed from that illustrated in the figure (ie. regions doped P, would be doped N, and vice-versa) and, in the circuit, the supply voltage polarity is also reversed.

Further, in the embodiment of FIG. 3, the MOSFET structure included an epilayer, which was lightly doped, while the substrate was heavily doped with ions of the same polarity as in the epilayer. In still other embodiments the MOSFET may be constructed without an epilayer, as is known, in which case the substrate is lightly doped and serves the function of an epilayer.

It is appreciated that MOSFET manufacturers typically specify the maximum voltage that may be safely applied across the insulating layer (23, 25, 27) of the FET transistor 2 (the breakdown voltage) without causing damage (breakdown) of that layer, expressed in terms of a static DC voltage. The manufacturer encourages a conservative approach to that breakdown voltage, and, thus, no information is typically given that takes into account the amount of electrical power behind the voltage source or the duration through which such voltage must persist in order to cause permanent damage to the insulating layer.

Although static electricity typically involves very large voltages, the amount of electricity behind that voltage is quite small. Moreover, because of the resistance inherent in the current path over which the static charge may transfer (via current flow) from an external source into the transistor, some finite amount of time is required before sufficient charge can accumulate in the transistor to develop a voltage high enough (and with sufficient power behind it) to cause breakdown and damage the insulating layer. Thus the breakdown voltage specified by the manufacturer may not fairly characterize the actual breakdown characteristic of the gate insulating layer when static electricity is involved.

Irrespective of the physics of insulation breakdown in an MOSFET when static electricity is involved, the action of the ancillary bipolar junction transistor formed in the substrate would appear to quickly shunt the static charge as it transfers into the MOSFET, preventing the accumulation in the FET of such static charge necessary to build up to a voltage at which the insulating layer is destroyed, whatever that voltage may be in the foregoing circumstances. Thus should reference be made to a breakdown voltage in this specification or in the claims which follow, it should be understood that such term is not intended to refer to the lower breakdown voltage specified by the manufacturer of a MOSFET device but is the voltage, presently undetermined, at which the insulating gate layer is destroyed or ruined through application of static electric charge.

Further, the convention used in the claims to describe the doping of the semiconductor material is that the term "P" denotes a doping of the semiconductor material with acceptor ions (and is regarded as a first polarity type), "P–" denotes a light doping of acceptor ions and "P+" denotes a heavy doping of acceptor ions in the semiconductor material. Likewise, "N" denotes a doping with donor ions (and is regarded as a second opposite polarity type), "N–" denoting a light doping of donor ions, and "N+" a heavy doping with such donor ions.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. A MOSPET comprising:
    a substrate of semiconductive material, said substrate being doped with ions to define one polarity type;
    a well formed in said substrate, said well being doped with ions to define a second polarity type region;
    a plurality of source/drain regions formed in the upper surface of said wells said source/drain regions being heavily doped with ions of said one polarity type, said source/drain regions being spaced apart and adjacent one another to define gaps therebetween;
    a plurality of insulating layers, each of said insulating layers being deposited upon the upper surface of said well and fitting within a respective one of said plurality of gaps;
    a plurality of conductors, each of said plurality of conductors being deposited upon and fitting on a respective one of said plurality of insulating layers;
    a first contact region formed within said well to one side of said plurality of source/drain regions and spaced therefrom, said contact region being heavily doped with ions of said second polarity type;
    a second contact region formed within said substrate located to a side of said contact region that is outside said well, said another contact region being heavily doped with ions of said first polarity type; and
    a third contact region formed in said substrate to another side of said plurality of source/drain regions opposite to said one side outside sad well, said third contact pad. region being heavily doped with ions of said first polarity type;
    said third contact region being laterally spaced close enough from an outer one of said source/drain regions in said well without any additional diffusion layer therebetween to define therewith a bipolar transistor; and said first contact region and said second contact region defining a diode cooperating with said bipolar transistor to protect said insulating layers against rupture by static electrical charge.

2. The invention as defined in claim 1, further comprising:
    an epilayer formed in said substrate, said epilayer being lightly doped with ions of said first polarity type; wherein said substrate is heavily doped with said ions of said first polarity type; and wherein said well is formed in an upper surface of said epilayer, and said well is lightly doped with ions of said second polarity type; wherein said second and third contact regions are located within said epilayer.

3. The invention as defined in claim 2, wherein said substrate is lightly doped with ions of said first polarity type; and wherein said well is lightly doped with ions of said second polarity type.

4. A p-channel MOSFET comprising:

a substrate of semiconductive material, said substrate being doped P;

an N-well formed in said substrate, said N-well being doped N;

a plurality of P+ doped regions formed in the upper surface of said N-well, said P+ doped regions being spaced apart and adjacent one another to define gaps there between;

a plurality of insulating layers, each of said insulating layers being deposited upon the upper surface of said N-well and fitting within a respective one of said plurality of gaps;

a plurality of conductors, each of said plurality of conductors being deposited upon and fitting on a respective one of said plurality of insulating layers;

an N+ region formed within said N well to one side of said plurality of P+ doped regions and spaced therefrom;

a P+ region formed within said substrate located to the side of said N+ region outside said N well that is remote from said plurality of P+ doped regions and defining a diode therewith; and an additional P+ region formed in said substrate to another side of said plurality of P+ regions outside said N well opposite to said one side, wherein an outer one of said P+ regions defining said p-channel MOSPET in said N well is laterally spaced from and close enough to said additional P+ region defining said p-channel MOSFET in said substrate without any additional diffusion regions therebetween to define therewith a bipolar transistor, said bipolar transistor cooperating with said diode to protect said insulating layers against rupture by static electrical charge.

5. The invention as defined in claim 4, wherein said substrate is heavily doped P+; and further comprising:

an epilayer formed in said P+ substrate overlying said P+ substrate, said epilayer being lightly doped P−; wherein said N-well is formed in an upper surface of said epilayer, said N well being lightly doped N−; and wherein each of said P+ region and said additional P+ region are located in said epilayer.

6. The invention as defined in claim 5, wherein said substrate is lightly doped P−; and wherein said N-well is lightly doped N−.

7. A p-channel MOSFET comprising:

a P+ substrate of semiconductor material, an epilayer formed in said P+ substrate overlying said P+ substrate, said epilayer being lightly doped P−;

an N well formed in an upper surface of said epilayer, said N well being doped N−;

a plurality of P+ doped regions formed in the upper surface of said N well, said P+ doped regions being spaced apart and adjacent one another to define gaps there between;

a plurality of insulating layers, each of said insulating layers being deposited upon the upper surface of said N well and fitting within a respective one of said plurality of gaps;

a plurality of conductors, each of said plurality of conductors being deposited upon and fitting on a respective one of said plurality of insulating layers;

an N+ region formed within said N well to one side of said plurality of P+ doped regions and spaced therefrom;

a P+ region formed within said epilayer located to the side of said N+ region that is remote from said plurality of P+ doped regions defining a diode with said N+ region; and an additional P+ region formed in said epilayer to another side of said plurality of P+ regions opposite to said one side, wherein an outer one of said P+ regions in said N well defining said p-channel MOSFET is laterally spaced from said additional P+ region in said epilayer defining said p-channel MOSFET without intervening diffusion regions to define therewith a bipolar transistor cooperating with said diode to protect said insulating layers front the effects of electrostatic charge.

* * * * *